(12) United States Patent
Arunachalam (10) Patent No.: US 9,684,047 B2
(45) Date of Patent: Jun. 20, 2017

(54) **METHOD AND SYSTEM FOR RAPID MRI ACQUISITION USING TAILORED SIGNAL EXCITATION MODULES (*RATE*)**

(76) Inventor: Arjun Arunachalam, Tiong Bahru (SG)

( * ) Notice: Subject to any disclaimer, the term of this patent is extended or adjusted under 35 U.S.C. 154(b) by 756 days.

(21) Appl. No.: 14/123,186

(22) PCT Filed: Feb. 23, 2012

(86) PCT No.: PCT/IN2012/000127
§ 371 (c)(1),
(2), (4) Date: Nov. 29, 2013

(87) PCT Pub. No.: WO2012/127494
PCT Pub. Date: Sep. 27, 2012

(65) Prior Publication Data
US 2014/0091798 A1    Apr. 3, 2014

(30) Foreign Application Priority Data

Sep. 9, 2011    (IN) .......................... 2547/MUM/2011

(51) Int. Cl.
*G01R 33/54*    (2006.01)
*G01R 33/483*    (2006.01)
(Continued)

(52) U.S. Cl.
CPC .......... *G01R 33/54* (2013.01); *G01R 33/4833* (2013.01); *G01R 33/4824* (2013.01);
(Continued)

(58) Field of Classification Search
CPC    G01R 33/54; G01R 33/4833; G01R 33/4824; G01R 33/4836; G01R 33/5611; G01R 33/56308
See application file for complete search history.

(56) References Cited

U.S. PATENT DOCUMENTS 5,926,022 A * 7/1999 Slavin ................ G01R 33/5615
                                                      324/300
6,144,873 A    11/2000 Madore et al.
(Continued)

OTHER PUBLICATIONS

International Search Report, mailing date Nov. 22, 2012, for corresponding International Application No. PCT/IN2012/000127.
(Continued)

*Primary Examiner* — Rodney Bonnette
(74) *Attorney, Agent, or Firm* — Intellectual Property Law Group LLP (57) ABSTRACT

A system and method for rapid acquisition of MRI data at multiple points in time in an. MRI scan using tailored excitation modules, said method comprising the steps of: obtaining tailored signal excitation modules by using RF excitation pulses in combination with one or more magnetic field gradients; acquiring an aliased k-space dataset at a point in time using a pulse sequence that employs said obtained tailored signal excitation modules, which tag and overlap distinct k-space points; repeating steps (a) and (b) for acquiring aliased k-space datasets at multiple time points in a scan while tagging the overlapped, k-space points as a function of time to obtain an accelerated k-t dataset; undoing k-space aliasing m the acquired k-space datasets by Fourier transforming them along the time axis followed by a filtering process to separate the overlapped points; and performing a Fourier transformation along one or more axes, of the un-aliased k-space datasets to generate image frames for the different time points at which data was acquired.

30 Claims, 6 Drawing Sheets

(51) Int. Cl.
*G01R 33/48* (2006.01)
*G01R 33/561* (2006.01)
*G01R 33/563* (2006.01)

(52) U.S. Cl.
CPC ...... *G01R 33/4836* (2013.01); *G01R 33/5611* (2013.01); *G01R 33/56308* (2013.01)

(56) References Cited

U.S. PATENT DOCUMENTS

| | | | | |
|---|---|---|---|---|
| 7,570,054 B1* | 8/2009 | Lin | ............... | G01R 33/34084 |
| | | | | 324/307 |
| 7,683,620 B2* | 3/2010 | Lin | ............... | G01R 33/482 |
| | | | | 324/309 |
| 2008/0068014 A1* | 3/2008 | Dannels | ............... | G01R 33/561 |
| | | | | 324/312 |
| 2011/0148410 A1 | 6/2011 | Zaitsev et al. | | |
| 2014/0111201 A1* | 4/2014 | Kim | ............... | G01R 33/543 |
| | | | | 324/309 |

OTHER PUBLICATIONS

Written Opinion of the International Searching Authority, mailing date Nov. 22, 2012, for corresponding International Application No. PCT/IN2012/000127.

\* cited by examiner

FIGURE 6 ically available MRI systems store a library of such pulse sequences that can be prescribed to meet the needs of many different clinical applications. Research MRI systems include a library of clinically proven pulse sequences and they also enable the development of new pulse sequences.

METHOD AND SYSTEM FOR RAPID MRI ACQUISITION USING TAILORED SIGNAL EXCITATION MODULES (RATE)

This application claims priority from Indian Patent Application No. 2547/MUM/2011 filed on 9 Sep. 2011.

FIELD OF INVENTION

This invention relates to the field of imaging.

Particularly, this invention relates to magnetic resonance imaging (MRI) methods and systems.

More particularly, this invention relates to methods and systems for increasing acquisition speed of MR data during a conventional imaging scan.

Still particularly, this invention relates to methods and systems for Rapid MRI Acquisition using Tailored Signal Excitation modules (RATE).

BACKGROUND OF THE INVENTION

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear" or a "Cartesian" scan. The spin-warp scan technique is discussed in a prior art citation, 'Edelstein W A, Hutchison J M S, Johnson G, Redpath T. K-space substitution: Spin-Warp MR Imaging and Applications to Human Whole-Body Imaging. Physics in Medicine and Biology 1980; 25:751-756'. The method, referred to as spin-warp imaging, employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

A fundamental limitation of MRI is that only a sequential acquisition of "views" in k-space is possible. Such a sequential acquisition of k-space data places a limitation on the maximum Imaging speeds that can be achieved in MRI. Despite significant advances, physical and physiological constraints have prevented any further increases in data acquisition using magnetic field gradients. Since only a sequential acquisition of views is possible, fundamental restrictions are placed on fulfilling the competing requirements of spatial and temporal resolution in a dynamic MRI acquisition.

PRIOR ART

One particular application of MRI is to capture the time evolution of a signal of interest through the fast acquisition of k-space in time. K-space data acquired in time for this purpose is referred to in the art as "k-t space". Over the years, several methods have been proposed for the fast acquisition of k-t space in a dynamic MRI scan. While some of these methods make certain assumptions about the imaged object and/or temporal signal of interest, other techniques operate independent of the same.

The methods which make certain assumptions about the imaged object and/or temporal signal of interest are seen in the following prior art references: Jones R A et al; *K-space substitution: A novel dynamic imaging technique. Magn Reson Med* 1993; 29:830-834, Van Vaals J J et al; *"Keyhole" method for accelerating imaging of contrast agent uptake. J Magn Reson Imaging* 1993; 3:671-675, Suga M et al *Keyhole method for high-speed human cardiac cine MR imaging. J Magn Reson Imaging* 1999; 10:778-783; Doyle M et al; *Block Regional Interpolation scheme for k-space (BRISK): A rapid cardiac imaging technique, Magn Reson Med* 1995; 33:163-170; Doyle M et al; *Block Rapid cardiac imaging with turbo BRISK. Magn Reson Med* 1995; 37:410-417, Korosec F R et al; *Time-resolved contrast-enhanced 3D MR angiography; Magn Reson Med* 1996; 36:345-351, Tsao J et al; *k-t Blast and k-t SENSE: Dynamic MRI with High Frame Rate Exploiting SpatioTemporal Correlations; Magn Reson Med* 2003; 50:1031-1042, Hu X et al *Reduction of field of view for dynamic imaging; Magn Reson Med* 1994; 31:691-694, Parrish T G et al; *Hybrid technique for dynamic imaging. Magn Reson Med* 2000; 44:51-55, Fredrickson J O et al; *Temporal resolution improvement in dynamic imaging; Magn Reson Med* 1996; 35:691-694, Scheffler K et al; *Reduced circular field-of-view imaging; Magn Reson Med* 1998; 40:474-480, Madore B et al; *Unaliasing by Fourier-encoding the overlaps using the temporal dimension (UNFOLD), applied to cardiac imaging and fMRI; Magn Reson Med* 1999; 42:813-828, Oesterle C et al; *Improvement of spatial resolution of keyhole effect images; Magn Reson Med* 1998; 39:244-250, Liang Z P et al; *An efficient method for dynamic magnetic resonance imaging; IEEE Trans Med*

Imaging 1994; 13:677-686, Webb A G et al; *Applications of reduced encoding MR imaging with generalized-series reconstruction (RIGR)*; J Magn Reson Imaging 1999; 17:109-119.

The methods which operate independent of the assumptions are seen in the following prior art references: Sodickson D K et al; *Simultaneous acquisition of spatial harmonics (SMASH): fast imaging with radiofrequency coil arrays;* Magn Reson Med 1997; 38:591-603, Pruessmann K P et al; *SENSE: sensitivity encoding for fast MRI. Magn Reson Med* 1999; 42:952-962, Pruessmann K P et al; *Advances in sensitivity encoding with arbitrary k-space trajectories; Magn Reson Med* 2001; 46:638-651, Griswold M A et al; *Generalized autocalibrating partially parallel acquisitions (GRAPPA); Magn Reson Med* 2002; 47:1202-1210, Lustig M et al; *Sparse MRI: The application of compressed sensing for Rapid MR Imaging; Magn Reson Med* 2007; 58:1182-1195.

The assumptions, when made, are typically done so to exploit any spatial and/or temporal redundancy that may exist in the data that is to be acquired.

Of the various dynamic MRI methods that make assumptions about the imaged object and/or temporal information, some are of particular interest given the invention. These are, techniques such as UNFOLD as disclosed in Madore B et al; *Unaliasing by Fourier-encoding the overlaps using the temporal dimension (UNFOLD), applied to cardiac imaging and fMRI. Magn Reson Med* 1999; 42:813-828 and reduced FOV approaches as disclosed in references Hu X et al; *Reduction of field of view for dynamic imaging; Magn Reson Med* 1994; 31:691-694, Parrish T G et al; *Hybrid technique for dynamic imaging; Magn Reson Med* 2000; 44:51-55, Fredrickson J O et al; *Temporal resolution improvement in dynamic imaging; Magn Reson Med* 1996; 35:691-694, Scheifler K et al; *Reduced circular field-of-view imaging; Magn Reson Med* 1998; 40:474-480. These operate on the assumption that dynamic information is largely confined to a portion of the imaged object and methods such as keyhole imaging as referenced in Jones R A et al; *K-space substitution: A novel dynamic imaging technique; Magn Reson Med* 1993; 29:830-834, Van Vaals J J et al; *"Keyhole" method for accelerating imaging of contrast agent uptake; J Magn Reson Imaging* 1993; 3:671-675, Suga M et al; *Keyhole method for high-speed human cardiac cine MR imaging, J Magn Reson et al; Imaging* 1999; 10:778-783, Doyle M et al; *Block Regional Interpolation scheme for k-space (BRISK): A rapid cardiac imaging technique; Magn Reson Med* 1995; 33:163-170, Doyle M et al; *Block Rapid cardiac imaging with turbo BRISK. Magn Reson Med* 1995; 37:410-417.

The prior art as disclosed in Korosec F R et al; *Time-resolved contrast-enhanced 3D MR angiography; Magn Reson Med* 1996; 36:345-351 make a similar assumption of the imaged object's k-space representation.

Provided their assumptions hold, these methods can tailor the acquisition of k-t data to capture information efficiently. For example, In UNFOLD; spatially distinct voxels are deliberately overlapped by under-sampling k-space while simultaneously tagging the overlapped voxels in time with a phase function. A Fourier transformation along the time axis of k-t space can then resolve the aliased voxels. In methods such as keyhole imaging and the like, while central k-space is acquired in every time frame, it is assumed that the higher spatial frequencies contain little or no dynamic information and are therefore acquired less frequently. Techniques such as Fourier interpolation, weighted substitution, utilizing a priori information as referenced in Oesterle C et al; *Improvement of spatial resolution of keyhole effect images; Magn Reson Med* 1998; 39:244-250, Liang Z P et al; *An efficient method for dynamic magnetic resonance imaging; IEEE Trans Med Imaging* 1994; 13:677-686, Webb A G et al; *Applications of reduced encoding MR imaging with generalized-series reconstruction (RIGR); J Magn Reson Imaging* 1999; 17:109-119 and sliding window reconstruction are then used to estimate the un-acquired data points. Irrespective of the assumptions, in all these approaches, the acquisition of k-t space is altered in an attempt to satisfy the competing requirements for spatial and temporal resolution.

Separately, image acceleration techniques falling under the category of Parallel Imaging (PMRI) as referenced in Sodickson D K et al; Manning W J. *Simultaneous acquisition of spatial harmonics (SMASH): fast imaging with radiofrequency coil arrays; Magn Reson Med* 1997; 38:591-603, Pruessmann K P et al; *SENSE: sensitivity encoding for fast MRI; Magn Reson Med* 1999; 42:952-962, Pruessmann K P et al; *Advances in sensitivity encoding with arbitrary k-space trajectories; Magn Reson Med* 2001; 46:638-651, and Griswold M A et al; *Generalized autocalibrating partially parallel acquisitions (GRAPPA); Magn Reson Med* 2002; 47:1202-1210 and Compressed Sensing (CS) as referenced in Lustig M et al; *Sparse MRI: The application of compressed sensing for Rapid MR Imaging; Magn Reson Med* 2007; 58:1182-1195 have also been employed to increase spatial and/or temporal resolution of a dynamic MRI scan. While PMRI methods rely on spatial encoding provided by multiple RF coils to complement the MRI gradient encoding process, CS methods are applicable when certain conditions related to the sparsity of the MRI image or its representation in a transform domain are fulfilled. These techniques can be employed either independently or in tandem with any of the methods previously mentioned to accelerate a dynamic MRI scan. Despite the advances, applications such as interventional imaging, contrast enhanced MR Angiography, evaluation of cardiac function and abdominal imaging can always benefit from larger acceleration factors. The fundamental limitation in these and other dynamic imaging applications continues to be the trade-off between spatial and temporal resolution.

OBJECTS OF THE INVENTION

It is an object of the invention to provide an apparatus and a method for MRI that enables a vast reduction in the duration of dynamic MRI scans while ensuring better quality of reconstructed images.

SUMMARY OF THE INVENTION

According to this invention, there is provided a method for rapid acquisition of MRI data at multiple points in time in an MRI scan using tailored signal excitation modules, said method comprises the steps of:

(a) obtaining tailored signal excitation modules by using RF excitation pulses in combination with one or more magnetic field gradients;

(b) acquiring an aliased k-space dataset at a point in time using a pulse sequence that employs said obtained tailored signal excitation modules, which tag and overlap distinct k-space points;

(c) repeating steps (a) and (b) for acquiring aliased k-space datasets at multiple time points in a scan while tagging the overlapped k-space points as a function of time to obtain an accelerated k-t dataset;

(d) undoing k-space aliasing in the acquired k-space datasets by Fourier transforming them along the time axis followed by a filtering process to separate the overlapped points; and (e) performing a Fourier transformation along one or more axes of the un-aliased k-space datasets to generate image frames for the different time points at which data was acquired.

The invention utilizes combination of RF excitation pulses (B1 pulse) and gradient waveforms to deliberately overlap distinct k-space points. While the use RF excitation pulses and magnetic field gradients to tag and overlap voxels have previously been proposed in U.S. Ser. No. 61/142,987, in this invention, the RF excitation pulses and magnetic field gradients are designed tag and overlap k-space data points.

In addition to overlapping distinct k-space points, the invention uses the amplitude and phase of the RF excitation pulses to tag the overlapped k-space points. There is provided an amplitude varying means and phase varying means adapted to vary the amplitude and phase; respectively, of the tagging coefficients to separate overlapped k-space points to produce the full un-aliased k-t space dataset.

A Fourier transformation along the time axis of the acquired data can then resolve the overlapped k-space points. If the dynamic information in k-space remains confined to a small region, say its center, then the process described so far will suffice. When this assumption does not hold, the invention process can vary the phases and/or amplitudes of the RF excitation pulses to mitigate any image domain artefacts that may arise due to any residual, uncorrected k-space aliasing. The acquisition of k-t data in this manner results in an improvement in spatial and/or temporal resolution and/or spatial coverage.

Another aspect of this invention is the utilization of PMRI and CS methods to achieve additional acceleration. The total acceleration achieved by utilizing PMRI and CS methods, in the invention, is the product of the acceleration provided by the acquisition of aliased k-space data and that provided by the respective PMRI and/or CS technique.

Typically, the step (a) of obtaining tailored signal excitation modules includes the step of sampling an object directly in at least one spatial dimension.

Typically, the step (a) of obtaining tailored signal excitation modules includes the step of obtaining RF excitation pulses given by the following equation:

$$P_{rf}(t) = \sum_{n=1}^{N} a_n P_n(t - n\Delta t)$$

Typically, the step (c) of obtaining an accelerated k-t dataset includes the step of obtaining a signal at the overlapped k-space point given by the following equation:

$$k(t)_{alias} = \sum_{n=1}^{N} A_n k_n(t) e^{j\Phi(n,t)}$$

Typically, the step (d) includes the step of filtering the temporal frequency spectrum of said accelerated k-t dataset to separate the overlapped k-space points and produce the full un-aliased k-t space dataset.

Typically, the step (c) includes the step of varying the amplitude and phase of the tagging coefficients to separate overlapped k-space points to produce the full un-aliased k-t space dataset. Preferably, the step (c) includes the step of acceleration along a selected k-space axis, said axis of acceleration being a phase encoding axis.

Typically, the step (a) includes the step of obtaining tailored signal excitation modules that cause overlap of k-space points that lie on a plurality of lines in k-space spaced apart along a k-space axis.

Typically, the step (a) includes the step of obtaining tailored signal excitation modules designed for effecting 2D or 3D k-space aliasing.

Alternatively, the step (a) includes the step of obtaining tailored signal excitation modules designed for overlapping a plurality of k-space points spaced apart on a Cartesian k-space sampling trajectory.

Alternatively, the step (a) includes the step of obtaining tailored signal excitation modules designed for overlapping a plurality of k-space points spaced apart on a Non-Cartesian k-space sampling trajectory.

Typically, the step (c) includes the step of reconstructing a series of image frames from the k-t dataset produced.

In one embodiment, the step (a) includes the step of obtaining tailored signal excitation modules using a plurality of receiver coils to produce a corresponding plurality of accelerated k-space datasets and in which step (c) includes the step of processing a plurality of image frames and/or k-space datasets using a PMRI method for accelerating the MRI scan.

In another embodiment, the step (a) includes the step of obtaining tailored signal excitation modules to produce a corresponding plurality of k-space datasets and in which step (c) includes the step of processing a plurality of image frames and/or k-space datasets using a CS method for accelerating the MRI scan.

Alternatively, a corresponding plurality of k-space datasets and the plurality of image frames and/or k-space datasets are processed using image and/or k-space information acquired from a prior reference MRI scan.

According to this invention, there is also provided a system for rapid acquisition of MRI data at multiple points in time in an MRI scan using tailored signal excitation modules, said system comprises:

(a) MRI signal excitation means adapted to obtain tailored signal excitation modules by using RF excitation pulses along with one or more magnetic field gradients;

(b) aliasing means adapted to acquiring aliased k-space datasets at a time point using a pulse sequence that employs said obtained tailored signal excitation modules, which tag and overlap distinct k-space points and further adapted to repeat the step of acquiring aliased space datasets at multiple time points in the scan while tagging the overlapped k-space points as a function of time to obtain an accelerated k-t dataset;

(c) first Fourier Transformation means adapted to undo k-space aliasing in the acquired k-space datasets by Fourier transforming the acquired k-space datasets along the time axis followed by a filtering process to separate the overlapped k-space points; and (d) second Fourier Transformation means adapted to generate image frames, from the un-aliased k-space datasets, for the multiple time points at which data was acquired.

Typically, said excitation means includes sampling means adapted to sample an object directly in at least one spatial dimension.

Typically, said excitation means includes RF excitation pulse obtaining means adapted to obtain RF excitation pulses given by the following equation:

$$P_{rf}(t) = \sum_{n=1}^{N} a_n P_n(t - n\Delta t)$$

Typically, said aliasing means includes signal obtaining means adapted to obtain a signal at the overlapped k-space point given by the following equation:

$$k(t)_{alias} = \sum_{n=1}^{N} A_n k_n(t) e^{j\Phi(n,t)}$$

Typically, said system includes filtering means for filtering the temporal frequency spectrum of said accelerated k-t dataset to separate the overlapped k-space points and produce the full un-aliased k-t space dataset.

Typically, said system includes amplitude varying means and phase varying means adapted to vary the amplitude and phase, respectively, of the tagging coefficients to separate overlapped k-space points to produce the full un-aliased k-t space dataset.

Typically, said system includes acceleration means for obtaining an accelerated k-t space dataset along a selected k-space axis, said axis of acceleration being a phase encoding axis.

Typically, said system includes MRI signal excitation means adapted to obtain tailored signal excitation modules that cause overlap of k-space points that lie on a plurality of lines in k-space spaced apart along a k-space axis.

Alternatively, said MRI signal excitation means includes 2D MRI signal excitation means or 3D MRI signal excitation means adapted to obtain tailored signal excitation modules designed for effecting 2D or 3D k-space aliasing, respectively.

Alternatively, said MRI signal excitation means includes Cartesian MRI signal excitation means adapted to obtain tailored signal excitation modules designed for overlapping a plurality of k-space points spaced apart on a Cartesian k-space sampling trajectory.

Alternatively, said MRI signal excitation means includes Non-Cartesian MRI signal excitation means adapted to obtain tailored signal excitation modules designed for overlapping a plurality of k-space points spaced apart on a Non-Cartesian k-space sampling trajectory.

Alternatively, said system includes image frame reconstruction means adapted to reconstruct a series of image frames from the k-t dataset produced.

In one embodiment, said system includes a plurality of receiver coils for obtaining tailored signal excitation modules in order to produce a corresponding plurality of k-space datasets and further includes PMRI means adapted to process a plurality of image frames and/or k-space datasets using a PMRI method for accelerating the MRI scan.

In another embodiment, said system includes a plurality of receiver coils for obtaining tailored signal excitation modules in order to produce a corresponding plurality of k-space datasets and further includes CS means adapted to process a plurality of image frames and/or k-space datasets using a CS method for accelerating the MRI scan.

Typically, said system includes processing means wherein a corresponding plurality of k-space datasets and the plurality of image frame datasets are processed using image and/or k-space information acquired from a prior reference MRI scan.

BRIEF DESCRIPTION OF THE ACCOMPANYING DRAWINGS

The invention will now be described in relation to the accompanying drawings, in which.

DETAILED DESCRIPTION OF THE ACCOMPANYING DRAWINGS

According to this invention, there is provided a method and system for rapid acquisition of MRI data at multiple points in time in an MRI scan using tailored signal excitation modules.

The invention can be described as a method for Rapid MRI Acquisition using Tailored Signal Excitation modules (RATE).

The system includes RF excitation pulse obtaining means adapted to obtain RF excitation pulse $P_{rf}(t)$ used in RATE which pulse is given by the following equation:

$$P_{rf}(t) = \sum_{n=1}^{N} a_n P_n(t - n\Delta t) \quad (1)$$

Figure 1A:
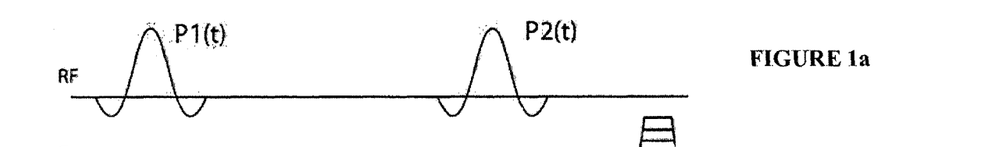
FIG. 1a illustrates RF pulses obtained by RF excitation pulse obtaining means where, N=2.
Figure 1B:
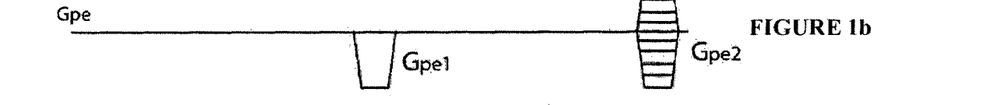
FIG. 1b illustrates gradient blips with amplitudes $G_{pe1}$ and $G_{pe2}$ in the primary phase encoding direction.
Figure 1C:
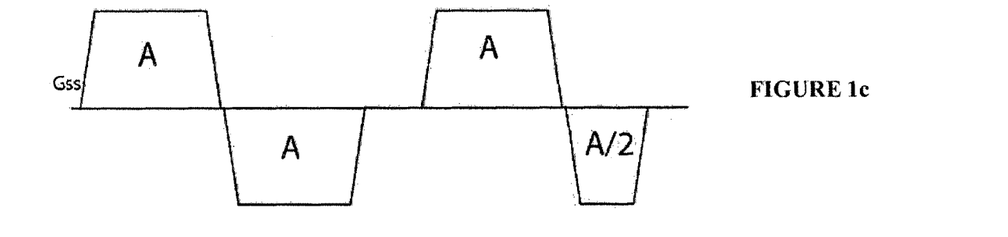
FIG. 1c illustrates that the areas of these gradient blips can either be constant or can be varied from one TR to the next and A denotes the areas of the respective slice select gradient and rewinder lobes.

Here $P_n(t)$ represents individual RF pulse envelopes, $a_n$ are tagging coefficients and $\Delta t$ is the delay between any two RF pulse envelopes. An example of the same is given in FIG. 1 for a 2D axial imaging process.

FIG. 1a illustrates RF pulses obtained by RF excitation pulse obtaining means where, N=2 in equation 1, above. The RF pulses $P_1(t)$ and $P_2(t)$ are slice selective, the flip angles of both the pulses are equal to θ. $P_1(t)$ and $P_2(t)$ excite the same slice and are accompanied by gradient blips (as seen in FIG. 1b) with amplitudes $G_{pe1}$ and $G_{pe2}$ in the primary phase encoding direction. The areas of these gradient blips can either be constant or can be varied from one TR to the next. Reference alphabet 'A' (in FIG. 1c) denotes the areas of the respective slice select gradient and rewinder lobes.

There is provided an MRI signal excitation means adapted to obtain tailored signal excitation modules.

The total signal resulting from this combination of gradient and RF pulses is given by the following equation:

$$S(t) = \int O(x, y)\{a_1 e^{-jk_1 y} + a_2 e^{-jk_2 y}\} e^{-jk_x x} d_x d_y \quad (2)$$

Here, $k_1 = \gamma(G_{pe1} + G_{pe2})yt_p$ and $k_2 = \gamma G_{pe2} yt_p$, $t_p$ is the duration of the gradient blips, $O(x,y)$ is a 2D slice of the imaged object and $a_1$, $a_2$ are the tagging coefficients, dependent on the steady state longitudinal magnetization and the flip angle $\theta$. Although not shown, equation 2 assumes that a readout gradient follows the pulses of FIG. 1 to acquire S(t). As is clear from equation 2, the sampled signal S(t) will be a linear combination of two distinct phase encodes $k_1$ and $k_2$. A block of RF and gradient pulses that causes distinct phase-encodes to overlap in this manner will here onwards be referred to as the RATE module and the parameter N in equation 1 will be referred to as the k-aliasing factor.

If the RATE module of FIG. 1 is inserted into a 2D imaging sequence that contains additional phase encoding gradient pulses, then the signal equation will be the following:

$$S(t) = \int O(x, y)\{a_1 e^{-jk_1 y} + a_2 e^{-jk_2 y}\} e^{-jk_y y} e^{-jk_x x} d_x d_y \quad (3)$$

Here, $k_y$ is a parameter dependent on the additional phase encoding gradient amplitudes and their durations respectively.

The block of pulses in FIG. 1 is one example of a RATE module for 2D imaging. These modules can be designed for different scenarios and inserted into any pulse sequence of choice. For example, a RATE module designed for 3D acquisitions will consist of, in addition to all the pulses shown in FIG. 1, gradient blips along the secondary phase encoding dimension also.

Another potential application involves non-Cartesian acquisitions where the k-aliasing module can utilize gradient waveforms along some or all gradient axes simultaneously to traverse the preferred trajectory.

There is provided a step of tagging overlapped phase-encodes and an aliasing means adapted to acquire aliased k-space datasets at a time point using a pulse sequence that employs said obtained tailored signal excitation modules, which tag and overlap distinct k-space points and further adapted to repeat the step of acquiring aliased k-space datasets at multiple time points in the scan while tagging the overlapped k-space points as a function of time to obtain an accelerated k-t dataset. The system further includes acceleration means for obtaining an accelerated k-t space dataset along a selected k-space axis, said axis of acceleration being a phase encoding axis.

The tagging coefficients in equation 3 are user defined. The magnitude and phase of these coefficients are dependent on the flip angle and phase of the individual RF pulse envelopes comprising $P_{rf}(t)$. Therefore, $a_n = A_n e^{-j\phi n}$ where $A_n$ is determined by the flip angles of some/all the RF pulses in $P_{rf}(t)$ and $\phi_n$ is the initial phase of the $n^{th}$ RF pulse envelope in $P_{rf}(t)$. Since the two overlapping phase encodes in eqn.3 have been weighted by the coefficients $a_1$ and $a_2$, they are said to be "tagged" by the same and the coefficients themselves are referred to as tagging coefficients. User-control of the tagging coefficients provides flexibility in the k-aliasing process. For example, given the two overlapped phase encodes in equation 2, the phases $\phi_1$ and $\phi_2$ of the tagging coefficients a1 and a2 can be varied from one time frame to the next in a pre-determined manner such that the k-space aliasing can be corrected through a post-processing process. This is described next.

There is further provided a step of K-space un-aliasing and a first Fourier Transformation means adapted to undo k-space aliasing in the acquired k-space datasets by Fourier transforming the acquired k-space datasets along the time axis followed by a filtering process to separate the overlapped k-space points.

Consider a first acquisition where N=2, $A_1 = A_2 = 1$, $\phi_1 = \phi_2 = 0$, such that two phase encodes $k_1$ and $k_2$ overlap onto a single k-space point $k_{alias} = k_1 + k_2$. Now, consider a 2$^{nd}$ scenario where all parameters remain the same except for $\phi_2$, which is set to $\pi$. The overlapped point $k_{alias}$ is now $k_1 - k_2$. Now, consider the acquisition of a time series of images where $A_1 = A_2 = 1$, $\phi 1 = \phi_2 = 0$ for every even time frame and $A_1 = A_2 = 1$, $\phi_1 = 0$, $\phi_2 = \pi$ for every odd time frame. The overlapped point $k_{alias}$ is then given by the following equation:

$$k_{alias} = k_1 + k_2 e^{j\pi t} \quad (4)$$

Here, t is the time frame number. If the overlapped phase-encodes contain dynamic information, then eqn.4 becomes the following:

$$k(t)_{alias} = k(t)_1 + k(t)_2 e^{j\pi t} \quad (5)$$

Figure 2:
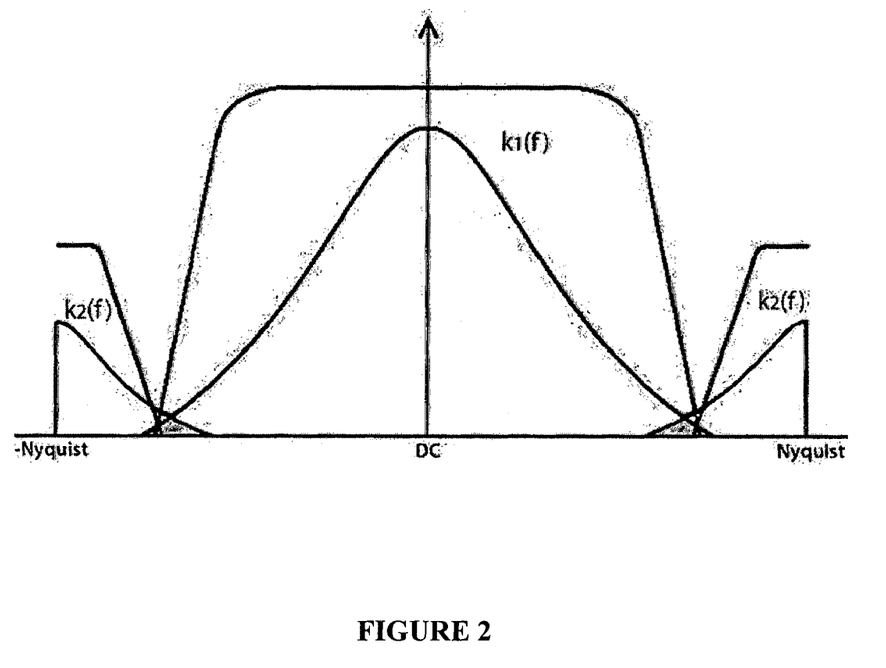
FIG. 2 illustrated two spectra can now be separated using a filtering means.

A Fourier transformation in time will give the temporal frequency spectrum of $k(t)_{alias}$. This spectrum will consist of the spectrum of $k_1(t)$, centered at DC, and that of $k_2(t)$, centered at the Nyquist frequency. The temporal frequency spectra of overlapped points are scaled by the amplitudes of the tagging coefficients, $A_1 = A_2 = 1$. As shown in FIG. 2, the two spectra can now be separated using a filtering means such as a Fermi filter.

In FIG. 2, the temporal spectra of two overlapped points is shown wherein $k_1(f)$ is more dynamic than $k_2(f)$. The Fermi filter used to extract $k_1(f)$ has a larger bandwidth compared to the filter used to extract $k_2(f)$.

For an arbitrary k-aliasing factor N, the signal at the overlapped k-space point is given by:

$$k(t)_{alias} = \sum_{n=1}^{N} A_n k_n(t) e^{j\Phi(n,t)} \quad (6)$$

In FIG. 2, it is assumed that $k_1(t)$ is more dynamic than $k_2(t)$. When this condition is fulfilled, the decaying tails of the spectrum of $k_2(t)$ are usually negligible relative to those of $k_1(t)$. This is the ideal condition for separating overlapped spectra in the temporal spectral domain. However, when this condition is violated, the separation will be incomplete and residual k-aliasing will remain, resulting in image artefacts. For example, if the overlapping points $k_1(t)$ and $k_2(t)$ are equally dynamic, then despite the shift in the spectra of the two points after Fourier transformation, there will be a significant overlap of the decaying tails of the two spectra.

One option is to use the amplitudes of the tagging coefficients to minimize image artefacts. For instance, if this data were to be acquired using tagging coefficients with amplitudes $A_1 = 1$ and $A_2 = 0.25$, the impact of overlapping on the spectrum centered at DC will be minimized by 12 DB due to difference in the amplitudes of the tagging coefficients. If the DC spectrum is of a phase-encode from central k-space, its restoration will significantly minimize image artefacts. The spectrum centered at Nyquist will remain corrupted and can be extracted using a filter with a smaller bandwidth that excludes the corrupted data points. Through this process, in effect, a larger portion of the temporal spectrum will then be allocated to the DC spectrum while the Nyquist spectrum will end up occupying a smaller portion. The smaller bandwidth allocated to the Nyquist spectrum results in some loss of its temporal information. This has been illustrated in FIG. 3.

Figure 3:
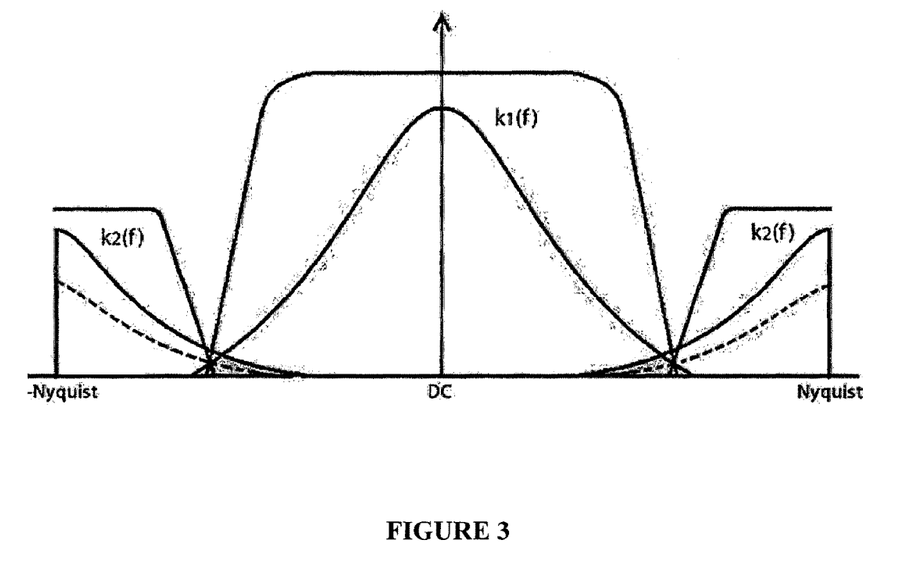
FIG. 3 illustrates a temporal spectra of two overlapped points wherein $k_1(f)$ and $k_2(f)$ are equally dynamic.

FIG. 3 illustrates a temporal spectra of two overlapped points wherein $k_1(f)$ and $k_2(f)$ are equally dynamic. The filtering means such as a Fermi filter used to extract $k_1(f)$ has a larger bandwidth compared to the filter used to extract $k_2(f)$ and RATE relies on the relative difference in the magnitudes of the overlapped points to suppress image artefacts. The dotted spectrum is of $k_2(f)$ after its tagging coefficient has been modified to introduce the relative amplitude difference.

Another option is to rely on an inherent k-space property wherein the magnitudes of the coefficients representing the lower spatial frequencies are usually larger than those of the higher spatial frequencies. In order to exploit this property, the phase $\phi_n$ of the tagging coefficients, as shown in FIG. 4, are chosen such that the spectra of the overlapping points with the larger magnitudes end up getting placed further away from each other in the temporal spectrum of $k_{alias}$.

Figure 4:
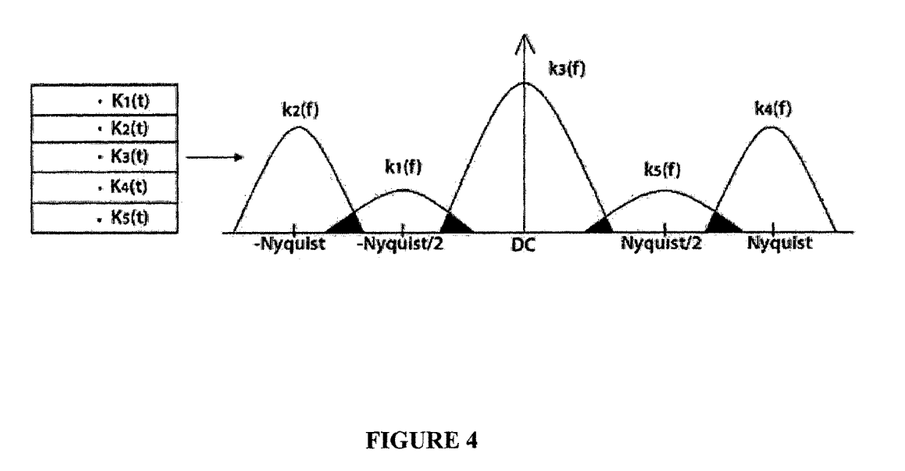
FIG. 4 illustrates overlapped regions for N=5 are shown wherein $k_2(f)$ and $k_4(f)$ are placed further away from $k_3(f)$ to ensure minimal corruption due to k-aliasing.

FIG. 4 illustrates, overlapped regions for N=5 are shown wherein $k_2(f)$ and $k_4(f)$ are placed further away from $k_3(f)$ to ensure minimal corruption due to k-aliasing. The spectra of $k_1(f)$ and $k_5(f)$ are impacted the most by k-aliasing.

Through this step, the spectra of the larger k-space coefficients do not overlap each other and the inherent variations in the magnitudes of the k-space coefficients minimize image artefacts. Again, filters with varying bandwidths can now be used to extract temporal information of the various overlapping points so that most of the points corrupted by k-aliasing are avoided.

The RATE module can be designed for any acceleration factor keeping in mind available SNR and other relevant scan parameters. A potentially powerful option is to use RATE in combination with PMRI/CS methods. When used in this manner, the total acceleration will be $N*A_{PMRI/CS}$ where $A_{PMRI/CS}$ is the acceleration due to the PMRI/CS process. For instance, if N=3 and $A_{PMRI/CS}$=3, then the total acceleration due to such a combined process will be 9.

The usefulness of using apriori information to resolve overlapped components in X-f space (f here denotes temporal frequency and X denotes spatial coordinates) has been previously reported in a prior art reference. A similar approach can be utilized in RATE wherein apriori information can be acquired from the image and/or k-space domains from a reference scan in order to further accelerate the RATE acquisition process.

Figure 5:
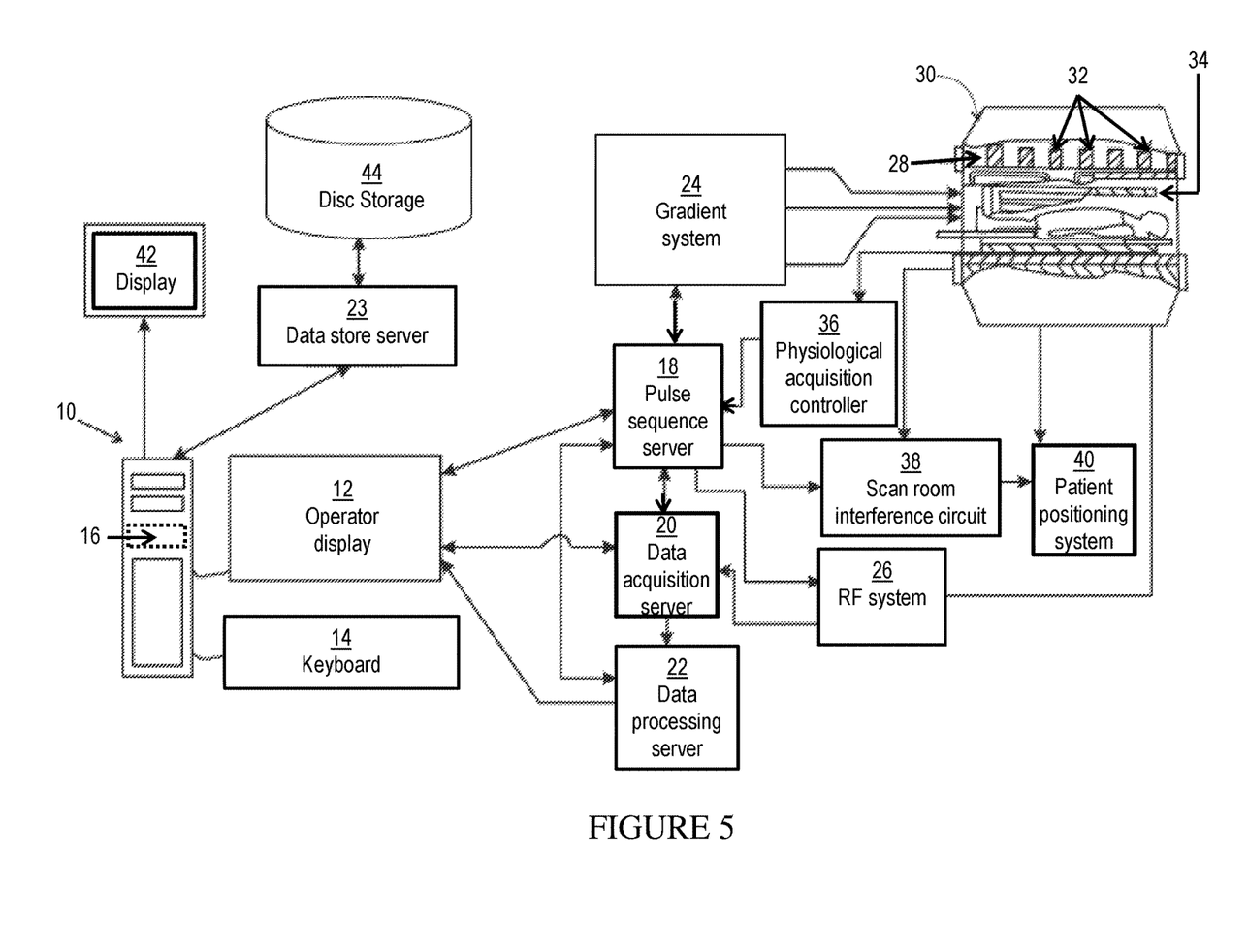
FIG. 5 illustrates the RATE invention employed in an MRI system.

Referring to FIG. 5, the RATE invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$ used for position encoding MR signals. The gradient coil assembly 28 forms part of a magnet assembly 30 that includes a polarizing magnet 32 and a whole-body RF coil 34. In RATE, the B1 excitation pulses are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. In RATE, the RF excitation pulses may be applied to the whole body RF coil 34 or to one or more local coils or coil arrays (not shown in FIG. 1). The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2}, \qquad (7)$$

and the phase of the received MR signal may also be determined:

$$\phi=\tan^{-1}Q/I. \qquad (8)$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, PMRI reconstruction of undersampled k-space data and the like. Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other, facilities.

Figure 6:
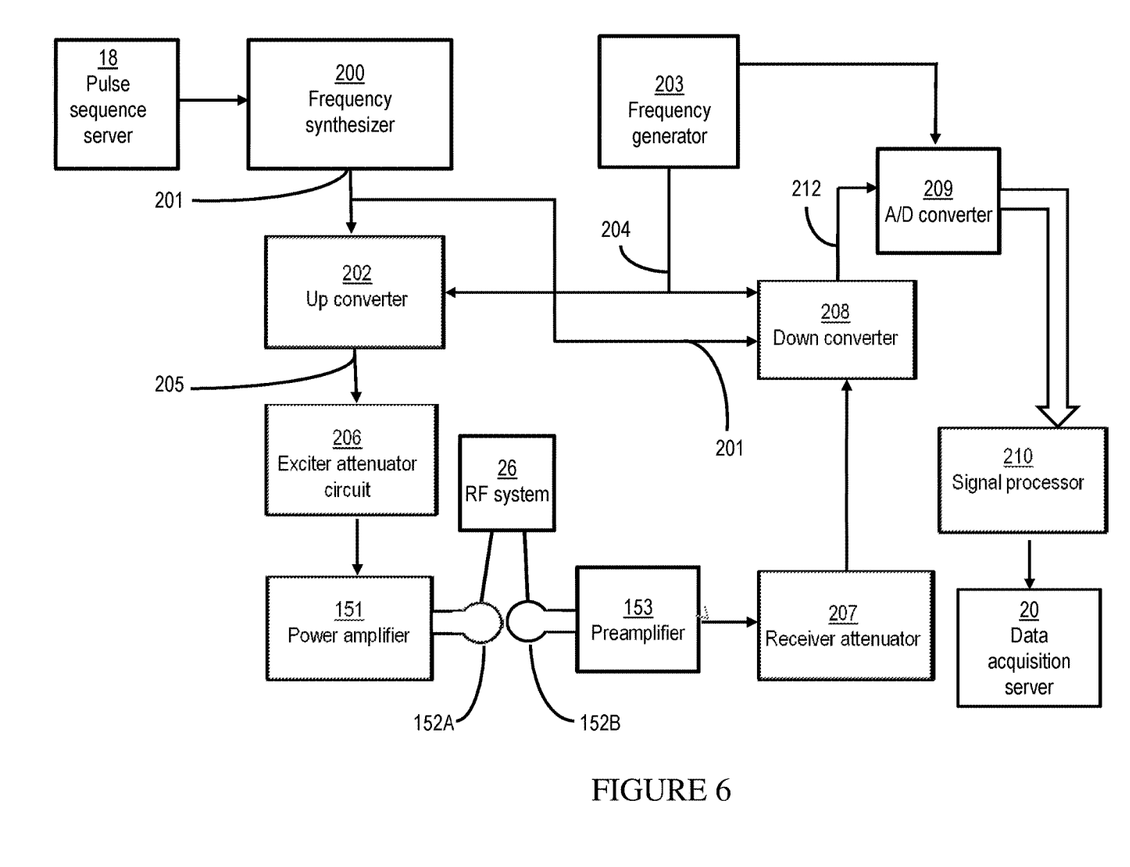
FIG. 6 illustrates the RF system used in an MRI scanner for signal excitation and reception.

As shown in FIG. 5, the RF system 26 may be connected to the whole body RF coil 34, or as shown in FIG. 6, a transmitter section of the RF system 26 may connect to one RF coil 152A and its receiver section may connect to a separate RF receiver coil 152B. Often, the transmitter section is connected to the whole body RF coil 34 and each receiver section is connected to a separate local coil 152B.

Referring particularly to FIG. 6, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may, be changed to enable any desired RF pulse envelope, for example the B1 excitation pulse of RATE, to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A. Referring still to FIG. 6 the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 is produced by a reference frequency generator 203.

To practice a preferred embodiment of the invention, MRI data is acquired using pulse sequences, on an MRI scanner that employ specially designed RATE modules as demanded by RATE invention. After collecting the data, the RATE reconstruction algorithm is employed to obtain the final images. The steps involved in the reconstruction process depend on the features of RATE that are utilized. One can employ CS, PMRI algorithms as well as apriori information from both the k-space and image domains to further accelerate the scan.

While this detailed description has disclosed certain specific embodiments of the present invention for illustrative purposes, various modifications will be apparent to those skilled in the art which do not constitute departures from the spirit and scope of the invention as defined in the following claims, and it is to be distinctly understood that the foregoing descriptive matter is to be interpreted merely as illustrative of the invention and not as a limitation.

I claim:

1. A method for rapid acquisition of MRI data at multiple points in time in an MRI scan using tailored signal excitation modules, said method comprising the steps of:
    (a) obtaining tailored signal excitation modules by using RF excitation pulses in combination with one or more magnetic field gradients;
    (b) acquiring an aliased k-space dataset at a point in time using a pulse sequence that employs said obtained tailored signal excitation modules, which tag and overlap distinct k-space points;
    (c) repeating steps (a) and (b) for acquiring aliased k-space datasets at multiple time points in a scan while tagging the overlapped k-space points as a function of time to obtain an accelerated k-t dataset;
    (d) undoing k-space aliasing in the acquired k-space datasets by Fourier transforming them along the time axis followed by a filtering process to separate the overlapped points; and
    (e) performing a Fourier transformation along one or more axes of the un-aliased k-space datasets to generate image frames for the different time points at which data was acquired.

2. The method as recited in claim 1 in which step (a) of obtaining tailored signal excitation modules includes the step of sampling an object directly in at least one spatial dimension.

3. The method as recited in claim 1 in which step (a) of obtaining tailored signal excitation modules includes the step of obtaining RF excitation pulses given by the following equation:

$$P_{rf}(t) = \sum_{n=1}^{N} a_n P_n(t - n\Delta t)$$

4. The method as recited in claim 1 in which step (c) of obtaining an accelerated k-t dataset includes the step of obtaining a signal at the overlapped k-space point given by the following equation:

$$k(t)_{alias} = \sum_{n=1}^{N} A_n k_n(t) e^{j\Phi(n,t)}$$

5. The method as recited in claim 1 in which step (d) includes the step of filtering the temporal frequency spectrum of said accelerated k-t dataset to separate the overlapped k-space points and produce the full un-aliased k-t space dataset.

6. The method as recited in claim 1 in which step (c) includes the step of varying the amplitude and phase of the tagging coefficients to separate overlapped k-space points to produce the full un-aliased k-t space dataset.

7. The method as recited in claim 1 in which step (c) includes the step of acceleration along a selected k-space axis, said axis of acceleration being a phase encoding axis.

8. The method as recited in claim 1 in which step (a) includes the step of obtaining tailored signal excitation modules that cause overlap of k-space points that lie on a plurality of lines in k-space spaced apart along a k-space axis.

9. The method as recited in claim 1 in which step (a) includes the step of obtaining tailored signal excitation modules designed for effecting 2D or 3D k-space aliasing.

10. The method as recited in claim 1 in which step (a) includes the step of obtaining tailored signal excitation modules designed for overlapping a plurality of k-space points spaced apart on a Cartesian k-space sampling trajectory.

11. The method as recited in claim 1 in which step (a) includes the step of obtaining tailored signal excitation modules designed for overlapping a plurality of k-space points spaced apart on a Non-Cartesian k-space sampling trajectory.

12. The method as recited in claim 1 in which step (c) includes the step of reconstructing a series of image frames from the k-t dataset produced.

13. The method as recited in claim 1 in which step (a) includes the step of obtaining tailored signal excitation modules using a plurality of receiver coils to produce a corresponding plurality of accelerated k-space datasets and in which step (c) includes the step of processing a plurality of image frames and/or k-space datasets using a PMRI method for accelerating the MRI scan.

14. The method as recited in claim 1 in which step (a) includes the step of obtaining tailored signal excitation modules to produce a corresponding plurality of k-space datasets and in which step (c) includes the step of processing a plurality of image frames and/or k-space datasets using a CS method for accelerating the MRI scan.

15. The method as recited in claim 1 in which a corresponding plurality of k-space datasets and the plurality of image frames and/or k-space datasets are processed using image and/or k-space information acquired from a prior reference MRI scan.

16. A system for rapid acquisition of MRI data at multiple points in time in an MRI scan using tailored signal excitation modules, said system comprising:
  (a) MRI signal excitation means adapted to obtain tailored signal excitation modules by using RF excitation pulses along with one or more magnetic field gradients;
  (b) aliasing means adapted to acquire aliased k-space datasets at a time point using a pulse sequence that employs said obtained tailored signal excitation modules, which tag and overlap distinct k-space points and further adapted to repeat the step of acquiring aliased k-space datasets at multiple time points in the scan while tagging the overlapped k-space points as a function of time to obtain an accelerated k-t dataset;
  (c) first Fourier Transformation means adapted to undo k-space aliasing in the acquired k-space datasets by Fourier transforming the acquired k-space datasets along the time axis followed by a filtering process to separate the overlapped k-space points; and
  (d) second Fourier Transformation means adapted to generate image frames, from the un-aliased k-space datasets, for the multiple time points at which data was acquired.

17. The system as recited in claim 16 in which said excitation means includes sampling means adapted to sample an object directly in at least one spatial dimension.

18. The system as recited in claim 16 in which said excitation means includes RF excitation pulse obtaining means adapted to obtain RF excitation pulses given by the following equation:

$$P_{rf}(t) = \sum_{n=1}^{N} a_n P_n(t - n\Delta t)$$

19. The system as recited in claim 16 in which said aliasing means includes signal obtaining means adapted to obtain a signal at the overlapped k-space point given by the following equation:

$$k(t)_{alias} = \sum_{n=1}^{N} A_n k_n(t) e^{j\Phi(n,t)}$$

20. The system as recited in claim 16 in which said system includes filtering means for filtering the temporal frequency spectrum of said accelerated k-t dataset to separate the overlapped k-space points and produce the full un-aliased k-t space dataset.

21. The system as recited in claim 16 in which said system includes amplitude varying means and phase varying means adapted to vary the amplitude and phase, respectively, of the tagging coefficients to separate overlapped k-space points to produce the full un-aliased k-t space dataset.

22. The system as recited in claim 16 in which said system includes acceleration means for obtaining an accelerated k-t space dataset along a selected k-space axis, said axis of acceleration being a phase encoding axis.

23. The system as recited in claim 16 in which said system includes MRI signal excitation means adapted to obtain tailored signal excitation modules that cause overlap of k-space points that lie on a plurality of lines in k-space spaced apart along a k-space axis.

24. The system as recited in claim 16 in which said MRI signal excitation means includes 2D MRI signal excitation means or 3D MRI signal excitation means adapted to obtain tailored signal excitation modules designed for effecting 2D or 3D k-space aliasing, respectively.

25. The system as recited in claim 16 in which said MRI signal excitation means includes Cartesian MRI signal excitation means adapted to obtain tailored signal excitation modules designed for overlapping a plurality of k-space points spaced apart on a Cartesian k-space sampling trajectory.

26. The system as recited in claim 16 in which said MRI signal excitation means includes Non-Cartesian MRI signal excitation means adapted to obtain tailored signal excitation modules designed for overlapping a plurality of k-space points spaced apart on a Non-Cartesian k-space sampling trajectory.

27. The system as recited in claim 16 in which said system includes image frame reconstruction means adapted to reconstruct a series of image frames from the k-t dataset produced.

28. The system as recited in claim 16 in which said system includes a plurality of receiver coils for obtaining tailored signal excitation modules in order to produce a corresponding plurality of k-space datasets and further includes PMRI means adapted to process a plurality of image frames and/or k-space datasets using a PMRI method for accelerating the MRI scan.

29. The system as recited in claim 16 in which said system includes a plurality of receiver coils for obtaining tailored signal excitation modules in order to produce a corresponding plurality of k-space datasets and further includes CS means adapted to process a plurality of image frames and/or k-space datasets using a CS method for accelerating the MRI scan.

30. The system as recited in claim 16 in which said system includes processing means wherein a corresponding plurality of k-space datasets and the plurality of image frame datasets are processed using image and/or k-space information acquired from a prior reference MRI scan.

\* \* \* \* \*